April 7, 1959 K. C. ALLISON 2,881,322

TUNING APPARATUS

Filed June 17, 1954 5 Sheets-Sheet 1

INVENTOR.
Kenneth C. Allison
BY Stanley Hart
Atty.

April 7, 1959 K. C. ALLISON 2,881,322

TUNING APPARATUS

Filed June 17, 1954 5 Sheets-Sheet 2

INVENTOR.
Kenneth C. Allison
BY [signature]
Atty.

April 7, 1959 K. C. ALLISON 2,881,322

TUNING APPARATUS

Filed June 17, 1954 5 Sheets-Sheet 3

INVENTOR.
Kenneth C. Allison
BY Stanley Hook
Atty.

TUNING APPARATUS

Filed June 17, 1954 5 Sheets-Sheet 4

INVENTOR.
Kenneth C. Allison
BY Stanley Hone
Atty.

April 7, 1959 K. C. ALLISON 2,881,322

TUNING APPARATUS

Filed June 17, 1954 5 Sheets-Sheet 5

INVENTOR.
Kenneth C. Allison
BY [signature]
Atty.

United States Patent Office 2,881,322

Patented Apr. 7, 1959

2,881,322

TUNING APPARATUS

Kenneth C. Allison, Crystal Lake, Ill.

Application June 17, 1954, Serial No. 437,355

8 Claims. (Cl. 250—40)

This invention relates to tuning apparatus for radio receivers wherein a clutch is operated to establish driving connection between the tuning element and an electric motor by energization of a solenoid, and upon reception of an incoming signal of sufficient strength within the range of the tuning element, such signal is applied through suitable means, such as a control tube and a relay responsive to the control tube, to open the motor and solenoid circuit and thereby stop movement of the tuning element and allow the receiver to remain tuned to the signal.

More particularly, this invention relates to tuning apparatus of the character indicated wherein each of a series of push buttons is selectively operable to close contacts forming part of an associated switching unit which is adjustable to occupy a control position corresponding to a pre-selected portion of the range of the tuning element, and such signal within said pre-selected portion of the range of the tuning element is so applied to the motor and solenoid circuit, and wherein an additional push button is selectively operable to similarly apply all incoming signals of effective strength within the complete range of the tuning element as such signals are received in sequence according to frequency.

It is also an object of this invention to provide tuning apparatus of the character indicated wherein a clutch is operated to establish driving connection between the tuning element and a manually operated driving means when the motor clutch solenoid is deenergized.

A further object of this invention resides in the provision of tuning apparatus as referred to wherein the switching units may be adjusted with precision accuracy to any desired control position over the complete range of the tuning element and wherein connection and disconnection of the clutch elements through which the tuning element is driven is so effectively controlled as to avoid any movement of the tuning element during such action of the clutch elements.

Further objects, features and advantages of this invention will become apparent from the following description when taken in connection with the accompanying drawings in which.

Figures 1, 2:
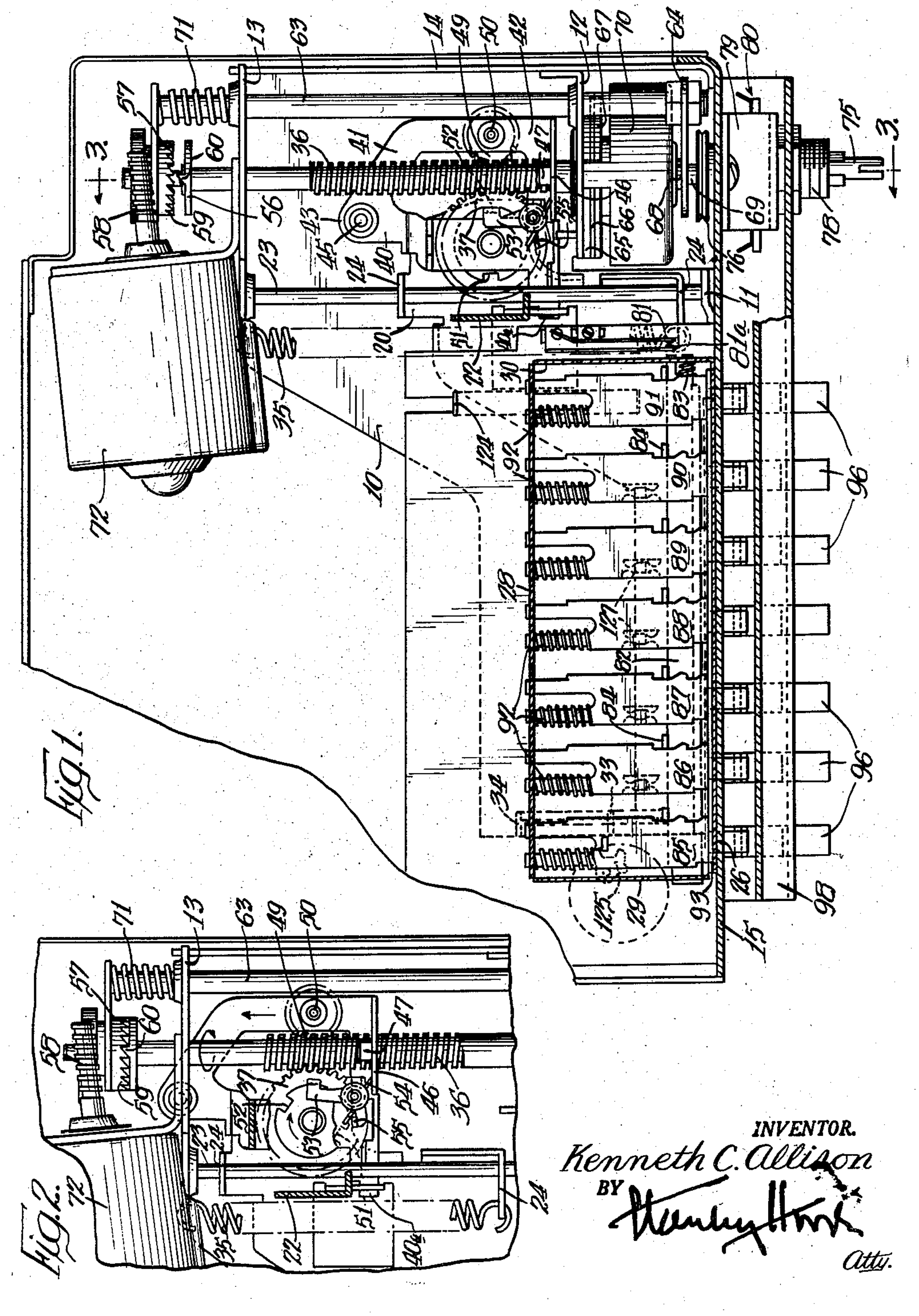
Fig. 1 is a fragmentary plan view of a tuning apparatus embodying the features of this invention, showing the tuning element driving means in disconnected relation to the motor.
Fig. 2 is a similar view showing the motor clutch in driving relation to the driving means for the tuning element.
Figure 3:
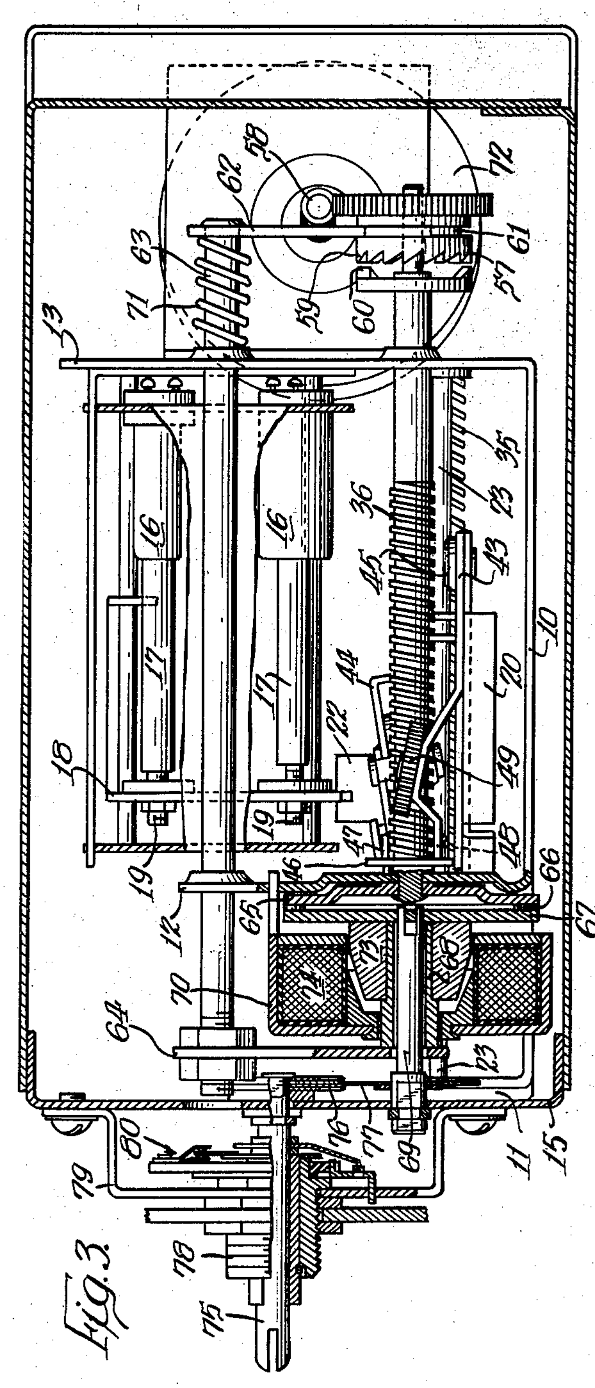
Fig. 3 is a vertical section taken on line 3—3 of Fig. 1.
Figure 4:
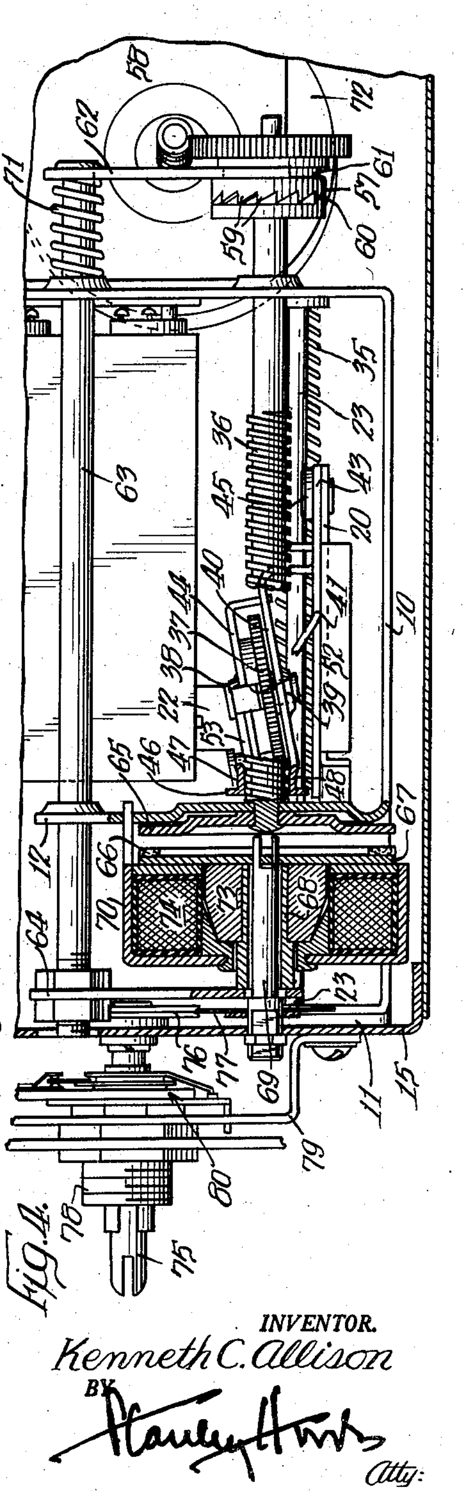
Fig. 4 is a fragmentary vertical section with parts in elevation and parts broken away for clarity, showing the motor clutch in driving relation to the tuning element.
Figure 5:
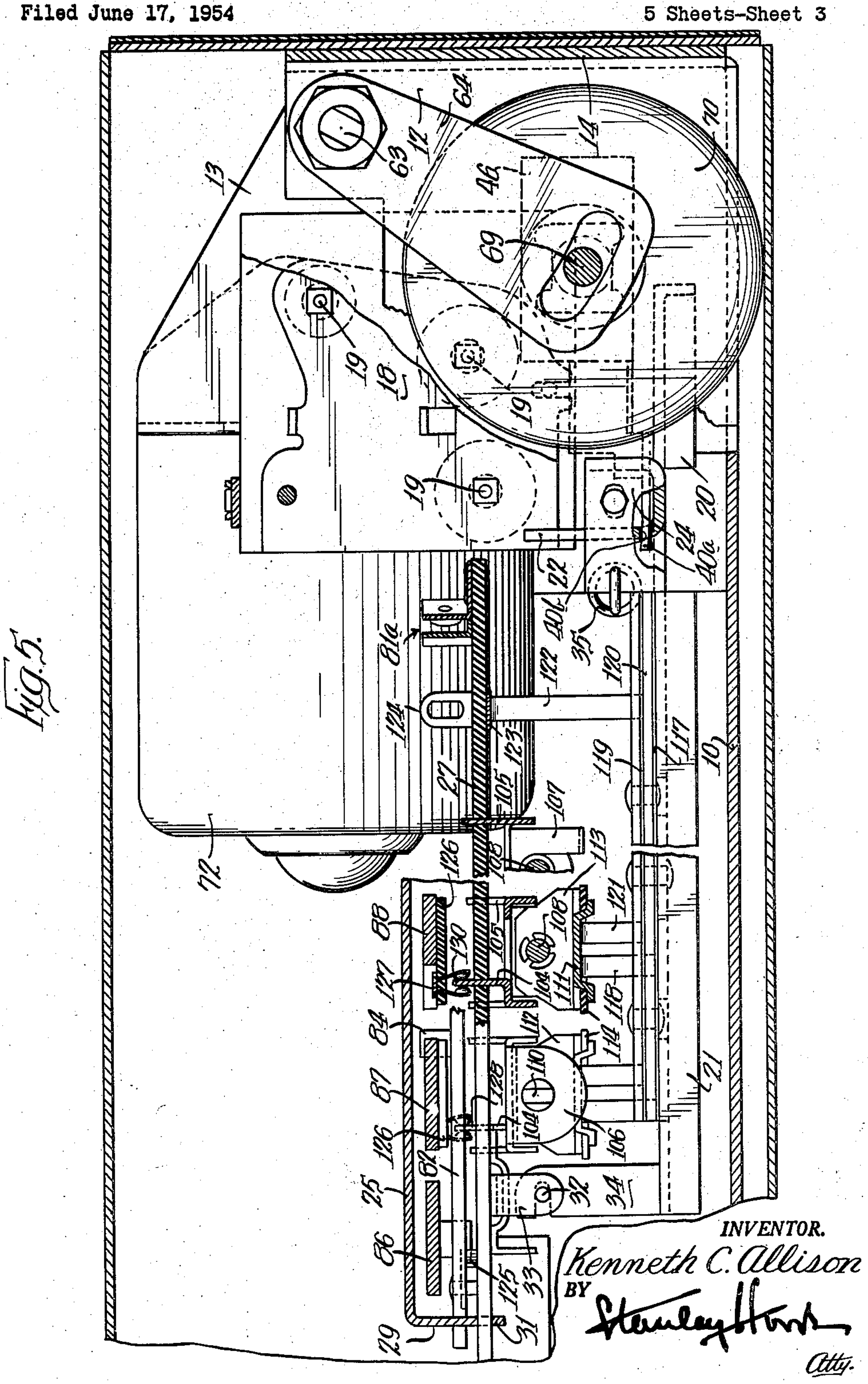
Fig. 5 is a vertical section with parts in elevation as the apparatus of this invention would appear when viewed rearwardly from the rear face of the front panel.
Figures 6, 7, 8:
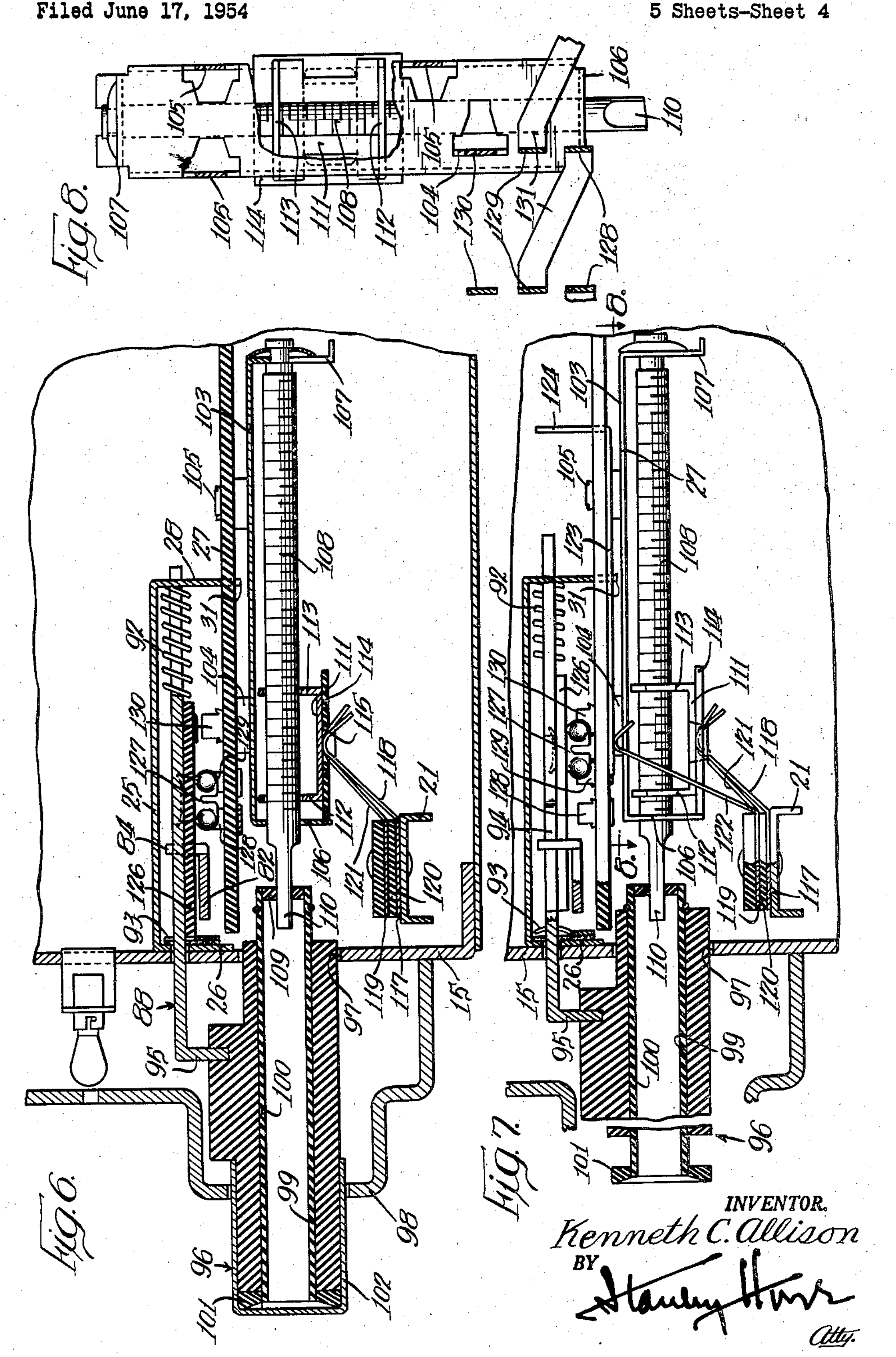
Fig. 6 is an enlarged vertical section taken lengthwise of the push button mechanism, when the latter is in retracted position.
Fig. 7 is a similar view showing the position of parts when the push button mechanism is in advanced position and the switching unit associated therewith in signal applying position.
Fig 8 is a top detail view of a portion of the switching unit shown in Fig. 7.

Referring more particularly to the drawings, numeral 10 designates a tuner base or frame. One section of the base 10 has a front edge defined by an upstanding lip 11 and a continuation of said section of the base has a front edge defined by an upright wall 12 in rearwardly offset parallel relation to the lip 11, and a rear edge defined by an upright wall 13 in rearwardly spaced parallel relation to the wall 12. The walls 12 and 13 are also joined by a connecting wall 14 extending upwardly from the section of the base 10 between the walls 12 and 13 at the end edge of said section. An upright panel 15 secured to the lip 11 presents a front wall along the full distance of the base having the lip 11 as well as the area forward of the wall 12.

The wall 13 provides support for a set of inductance coils 16 relative to which cores 17 have fore and aft movement in paths parallel to the connecting wall 14 for tuning the resonant circuits of an associated radio receiver. A plate 18 to which the outer ends of the cores 17 are fixed by screw threaded adjustable connection 19 provides for movement of said cores in unison.

A carriage made up of an end section 20 and an elongated mounting bar 21 from which the end section extends is slidably suspended on spaced parallel horizontal bearings parallel to the paths of the cores 17 whereby an ear 22 projecting upwardly from the end section 20 and engageable with the plate 18 of the core-coil assembly is operative to move the cores 17 in tuning action relative to the coils in response to sliding movement of the carriage. A rod 23 fixed at one end in the upright wall 13 and at its other end in a rearwardly offset end portion of the lip 11 is received in aligned openings formed in upstanding ears 24 on the end section 20 to provide one of the bearings on which the carriage is slidably supported. An inverted elongated box-like metal casing 25 having a longitudinal side wall 26 secured to the rear face of the front panel 15 supports an insulating panel 27 in upwardly spaced parallel relation to the base 10. A side wall 28 opposite the side wall 26 and spaced apart parallel walls 29 and 30 defining opposite ends of the case 25 are provided with downwardly extending staking ears 31 which are fastened through registering openings formed in the panel 27 to provide for rigid mounting of the latter on the casing 25. The other bearing on which the carriage has sliding support constitutes a rod 32 supported in fixed position below the panel 28 by means of a bracket 33 engaged by hook shaped upstanding ears 34 on the opposite end of the bar 21 of the carriage. The carriage is normally biased toward the rearward limits of its movement by a spring 35.

A driving worm 36 mounted for rotation about an axis parallel to the path of travel of the carriage by means of bearings provided in the upright walls 12 and 13 of the tuner base 10 has meshing engagement with a worm gear 37 to drive the carriage toward the forward limits of its movement against the biasing force of the spring 35. The gear 37 is supported on the side of the worm 36 which faces in the direction of the tuner base section having the lip 11 and such support is provided by bearings 38 and 39 in a bracket which straddles the worm 36 and has connection to the end section 20 of the carriage.

One section of the bracket includes a pair of strips 40 and 41 joined in spaced apart relation by a front bridge section 42 and a rear carriage connecting wing 43. The other section includes a strip 44 secured in upwardly spaced relation to the strip 40 whereby the strips 44 and 40 cooperate to provide parallel surfaces in downwardly and forwardly inclined relation to the axis of the worm 36 between which the worm gear 37 obtains bearing support at 38 and 39 for movement about an axis compatible with meshing interengagement of the gear 37 with the worm 36. The connecting wing 43 of the bracket has overlying face-to-face engagement with the upper horizontal surface of the end section 20 of the carriage and a swivel connection 45 joins the wing 43 and section 20 of the carriage whereby the bracket supporting the gear 37 may have relative swivelling adjustment about said connection 45. An opening formed in a flange 46 extending upwardly from the forward edge of the front bridge section 42 and through which the worm 36 projects toward its bearing support in the wall 12, is defined at its top nad bottom edges by rearwardly extending tongues 47 and 48. These tongues present opposed surfaces which have sliding engagement with the worm 36. Thus the bracket operates through the connection 45 adjoining the wing 43 and the section 20 of the carriage to pull the carriage forwardly against the bias of the spring 35 when the worm 36 is rotated to drive the bracket forwardly through the medium of the worm gear 37. An idler gear 49 supported in bearing 50 on the strip 42 of the bracket is in mesh with the worm 36 at the side of the latter facing away from the gear 37.

In order to lock the gear 37 against rotation so as to render the same effective to drive the carriage forwardly under power transmitted by rotation of the worm 36, a socket or recess 51 and a similar recess 52 formed in diametrically opposed positions on the upper face of the worm gear 37 are selectively engaged by a pivoted lever 53. The lever is biased into such engaged position by a spring 54. An angular extension 55 of the lever 54 operates to disengage the lever from lock relation with the gear 37 by abutment with the rear face of the wall 12 which obstructs the path of the extension 55 as the worm 36 is rotated to advance the gear 37 toward said wall 12. Upon such disengagement of the lever 53 from locked relationship with the gear 37, the latter is rendered free to rotate and thereby made inoperative to resist the tension of the spring 35 whereupon the carriage is returned to its rearward limit of movement or starting position. The gear 37 has a 180 degree range of travel during movement between rearward and forward limits of movement of the carriage. Thus gear 37 maintains a rotated position when the carriage is in its starting position wherein one of the notches or recesses 51 or 52 is presented for engagement by the lever 53 so as to lock the gear against rotation and thereby render the gear operative to cause the carriage to resume movement from such starting position toward its forward limit of movement under the control of the rotating worm 36.

An extension of the worm 36 projecting rearwardly from its bearing support in the wall 13 has a clutch disk 56 secured thereto at a distance inwardly from the rear end of said extension. The rear end of the extension supports a cooperating driver clutch disk 57 and worm gear 58 for axial sliding movement on the extension of the worm 36 toward and away from a position wherein teeth 59 on the disk 57 engages teeth 60 on the disk 56 to rotate the worm 36. Teeth 59 on the disk 57 are spaced apart a center to center distance of 60 degrees while the teeth 60 on the disk 56 are spaced apart a center to center distance three times that of the spacing of the teeth 59. Each tooth 59 is defined by an edge parallel to the axis of rotation of the disks and a second or leading edge inclined toward the disk 57 in the direction of its rotation at an angle of 45 degrees to the axis of rotation of the disks. Each tooth 60 is likewise defined by an edge parallel to the axis of rotation of the disks and a second edge similarly inclined to the disk 57 whereby mutual engagement of the disks 56 and 57 is established by interfitting relationship of the teeth at such inclined edges of the teeth 59 and 60. This arrangement of the interfitting surfaces of the teeth functions to provide positive driving connection between the disks 56 and 57 and at the same time acts to prevent reverse rotation of the worm 36 during process of engagement which might otherwise occur in the use of toothed clutch elements having edges bevelled away from the driver clutch element in the direction of its rotation.

The disk 57 is separated from the worm gear 58 by a reduced neck portion 61. This portion 61 is straddled by the forked outer end of a clutch release plate 62 fixed in radially projecting relation to the end of a supporting rod 63 slidable fore and aft in aligned openings in the walls 12 and 13. The opposite end of the rod 63 projecting forwardly through the opening in the wall 12 of the tuner frame has a plate 64 secured thereto. A disk 65 fixed to an end portion of the worm 36 projecting forwardly through its bearing opening in the wall 12 of the tuner frame is engaged about its forward face with a friction element 66 on the opposite face of a disk 67 fixed to the rearward end of a sleeve 68 having fore and aft sliding support on a shaft 69 journalled in suitable bearings in the upright front panel 15 of the tuner frame for rotation coaxially with the worm 36. A cup-like casing 70 suitably fastened about its rim to the wall of the tuner frame in encircling relation to the disks 65 and 67 has a base portion provided with a central opening through which the shaft 69 and the sleeve 68 extend. A spring 71 acting between the plate 62 and the rear face of the wall 13 of the tuner frame surrounding the rod 63 applies force to bias the latter into a position wherein the friction element 66 on the disk 67 is pressed against the disk 65 under control of the plate 64 and the sleeve 68, and wherein the disk 57 at the opposite end of the worm 36 is in disengaged relation to the cooperating disk 56. Accordingly, the shaft 69, through engagement of the disks 65 and 67, has driving connection with the worm 36 so as to provide for manual rotation of the worm under control of a manually controlled counter shaft and operating knob to be more particularly described hereinafter.

Upon movement of the rod 63 against the bias of the spring 71 to disengage the disks 65 and 67 and to accordingly establish engagement between the disks 56 and 57, the worm 36 is adapted to be driven by the worm gear 58 which engages a pinion carried by the shaft of an electric motor 72 secured to the wall 13 of the tuner frame. Such movement of the rod is accomplished by means of a core 73 fixed to the sleeve 68 and a solenoid coil 74 mounted in the casing 70 which is operable to move the core 73 into a home position upon energization of the coil 74. In response to such movement of the core 73 into a home position, the rod 63 is moved in the same direction under control of the sleeve 68 acting against the plate 64.

A shaft 75 having bearing support in the front wall or panel 15 for rotation about an axis in upwardly spaced parallel relation to the shaft 69 is provided with cooperating pinch disks 76 at the end thereof within the area behind the panel 15. The disks 76 have engagement with a disk 77 keyed on the shaft 69 whereby rotation of the shaft 75 by a suitable knob (not shown) at its outer end operates through the disks 76 and 77 to rotate the shaft 71. Thus when the solenoid coil 74 is de-energized the disks 65 and 67 are positioned in engaged relation under control of the biasing action of the spring 71 acting on the rod 63, the worm 36 is freed of its connection to the motor through disengagement of the disks 56 and 57 and the worm is rotatable through rotation of the manually operated shaft 75.

By means of a bushing 78 mounted in a bracket 79 at front side of the panel 15, in which bushing the shaft 75 has bearing support in alignment with its bearing support in the panel 15, suitable support is provided for a sensitivity switch 80 wherein switching action is accomplished about the axis of a rotor in coaxial relation to the shaft 75.

A switch 81 for operating the motor control circuit and a muting switch 81ª operable to silence the receiver during the tuning operation are mounted in the path of a latch bar 82 which is supported in guide openings formed in the end walls 29 and 30 of the case 25 for sliding movement in a path in spaced parallel relation to the front panel 15 and the insulating panel 27 secured to the case 25. A coil spring 83 encircling a prong forming one end of the latch bar acts to urge the latter in a direction away from engagement with the switches 81 and 81ª. Upstanding ears 84 on the latch bar are arranged in alignment with the line of motion of a series of plungers 85—86—87—88—89—90—91 supported in guide openings formed in the front and rear walls 26 and 28 respectively of the case 25 and registering openings formed in the front panel 15, so that said plungers travel in spaced apart paths parallel to the path of the carriage. Each plunger is biased into a retracted position by a coil spring 92 encircling an arm forming an end portion of each plunger and acting against the inner surface of the rear wall 28 of the case 25. Each plunger also has a handle portion in the form of a reduced stem projecting outwardly through the opening in the front panel 15 to define a shoulder at the junction of the stem and the portion of the plunger which extends inwardly of the front panel. This shoulder has abutment with a composite member 93 made up of a strip of spring metal and a strip of felt or other cushioning material with the latter engaging the inner face of the front wall 26 of the case 25 to limit movement of the plunger toward a retracted position under biasing action of the spring 92.

A locking shoulder 94 on each of the plungers (except plunger 91) has engagement with an ear 84 on the latch bar cooperating therewith to hold the plunger in inwardly moved or advanced position while the edge portion of each plunger (including plunger 91) is bevelled laterally outwardly to provide a camming surface engageable with the ear 84 in advance of movement of the shoulder 94 into locking position with the ear 84, whereby the latch bar is moved toward a position to close the switches 81 and 81ª. Accordingly, upon inward or advanced movement of one of the plungers, the camming surface of such plunger cooperates with the corresponding ear 84 on the latch bar to free any other plunger having interlocked engagement with another ear 84 of the latch bar. Plunger 91 therefore operates to release any other plunger that has locked engagement with the bar 82 but is not itself held in locked position by such bar.

Fixed to a downward extension 95 of the stem portion of each plunger is a push button 96 which is movable to operate an associated plunger between retracted and advanced positions via an opening provided in the front panel 15, and an opening in alignment with said panel opening formed in an escutcheon plate 98 suitably fastened to the outer face of the front panel 15. The button 96 on each of the plungers 86—87—88—89—90 is formed with a central bore 99 in which a cylindrical tube 100 is fitted for relative sliding and rotary movement about an axis parallel to the path of plunger associated therewith. Such movement of the tube 100 is facilitated by a head 101 which engages the front face of the button 96 at the mouth of the bore 99. The portion of the button 96 exposed at the front of the escutcheon plate is enclosed by a removable cap 102.

Suspended from the lower face of the insulating panel 28 in longitudinal alignment with the path of movement of each tube 100 is an elongated metal guide member 103. Upwardly extending staking ears 104 and 105 formed integrally with each guide member are fastened through openings in the panel 28 adjacent to such staking ears whereby the guide member is rigidly secured to the panel. Downwardly projecting ears 106 and 107 at opposite ends of the guide member 103 provide bearings for supporting a screw shaft 108 in axial alignment with the tube 100. The end of the tube 100 facing the screw shaft 108 is provided with a reduced central opening in which a flattened shank 110 forming an extension of the shaft 108 is received and keyed for rotation in unison with rotation of the tube 100 while also accommodating relative fore and aft sliding movement of the tube 100. Thus each tube 100 is operable to rotate the screw shaft 108 associated therewith and also is adapted to move fore and aft relative to the screw shaft 108 in accordance with the movement of the associated push button 96 between retracted and advanced positions. Each screw shaft supports a bracket in the form of a metal base plate 111 having two spaced upturned ears 112 and 113 in which aligned openings are provided for threaded engagement with the screw shaft 108. Flanges on opposite longitudinal edges of the guide member 103 present wings engageable by parallel upstanding edge portions of the ears 112 and 113 so as to trap the bracket against turning in unison with the screw shaft 108 associated therewith. Accordingly rotation of the screw shaft 108 through under control of the associated tube 100 causes the bracket supported by said screw shaft 108 to be fed lengthwise of the latter and to be thereby moved into selected positions along the path of the carriage. An insulating panel 114 having a central opening of rectangular outline through which a selected area 115 of the lower face of the plate 111 is exposed, is secured to the latter by means of downwardly offset ears 116 formed integrally with the plate, said ears having underlying engagement with edge portions of the opening in the panel 114 extending lengthwise of the path of adjustment of the plate. The area thus framed by the insulating panel 114 is thus adjustable to occupy a selected position within a range corresponding to the full distance travelled by the carriage between the limits of movement of the latter.

A switch contact for individual engagement with the area 115 of each of the plates 111 is provided by means of upwardly and rearwardly extending flexible fingers 118 formed integrally with a conductive strip 117 secured to the mounting bar 21 of the carriage so as to have lines of movement in alignment with the paths of adjustment of the areas 115 as determined by the spaced parallel arrangement of the screw shafts 108. Each finger 118 has a terminal portion which presents a bend curved convexly in the direction of the area 115 about an axis transverse to the path of movement of the finger 118 and a pair of cam surfaces which diverge uniformly from said bend in a direction away from said area 115. Such cam surfaces and the bend from which said cam surfaces extend are located at a distance from the carriage farther than the distance between the carriage and the contact area 115 adapted to be engaged by said terminal. Thus the terminal of each finger exerts a yielding pressure against the surfaces of the area 115 and the panel 114 framing said area while the finger 118 is moved along said surfaces under control of the carriage. The cam surfaces of the terminal engages the surface portions of the panel 114 located fore and aft of the area 115 so as to deflect the bend of the terminal out of contact with the area 115 except for a llimited portion of the length of travel of the bend opposite the area 115.

A second conductive strip 119 secured in superposed relation to but insulated as at 120 from the strip 117 is also provided with integral upwardly and rearwardly extending fingers 121 at distances apart corresponding to the spacing of the fingers 118 so that each area 115 is also engaged by a finger 121. The terminal of each finger 121 also presents a bend curved convexly in the direction of the area 115 and a pair of cam surfaces which diverge uniformly from said bend in a direction away from the area 115. While the bend of each terminal of the fingers 121 is in transverse alignment with the bend of the terminals of the fingers 118, the cam surfaces of the terminals of the fingers 121 are at a greater distance apart than the corresponding cam surfaces of the fingers 118 whereby the terminal of a finger 121 is deflected out of contact with the area 115 except when the terminal of the associated finger 118 is substantially at the middle of the area 115.

The strip 119 also includes a finger 122 in alignment with a contact member 123 secured to the underside of the panel 28 and extending a distance equal to the full travel of the carriage so as to provide for engagement with the contact member 123 during all movements of the carriage. Reference numeral 124 designates a wiring terminal forming an extension of the contact member 123 on the upper side of the panel 27.

Plunger 85 is adapted to actuate a power switch by means of an ear on the plunger engaging a switch operating lever 125. Inward movement of the plunger 85 accordingly operates to engage the switch lever 125 to open the switch and thereby stop operation of the receiver.

Plungers 86—87—88—89—90 each actuate a contact holder or panel 126 of insulating material through which a contact member 127 supported on said panel is movable toward and away from bridging engagement with contact blades 128 and 129 as well as blade 130 forming an upward extension of one of the staking ears 104 through which the guide member 103 is fastened to the panel 27.

Figure 9:
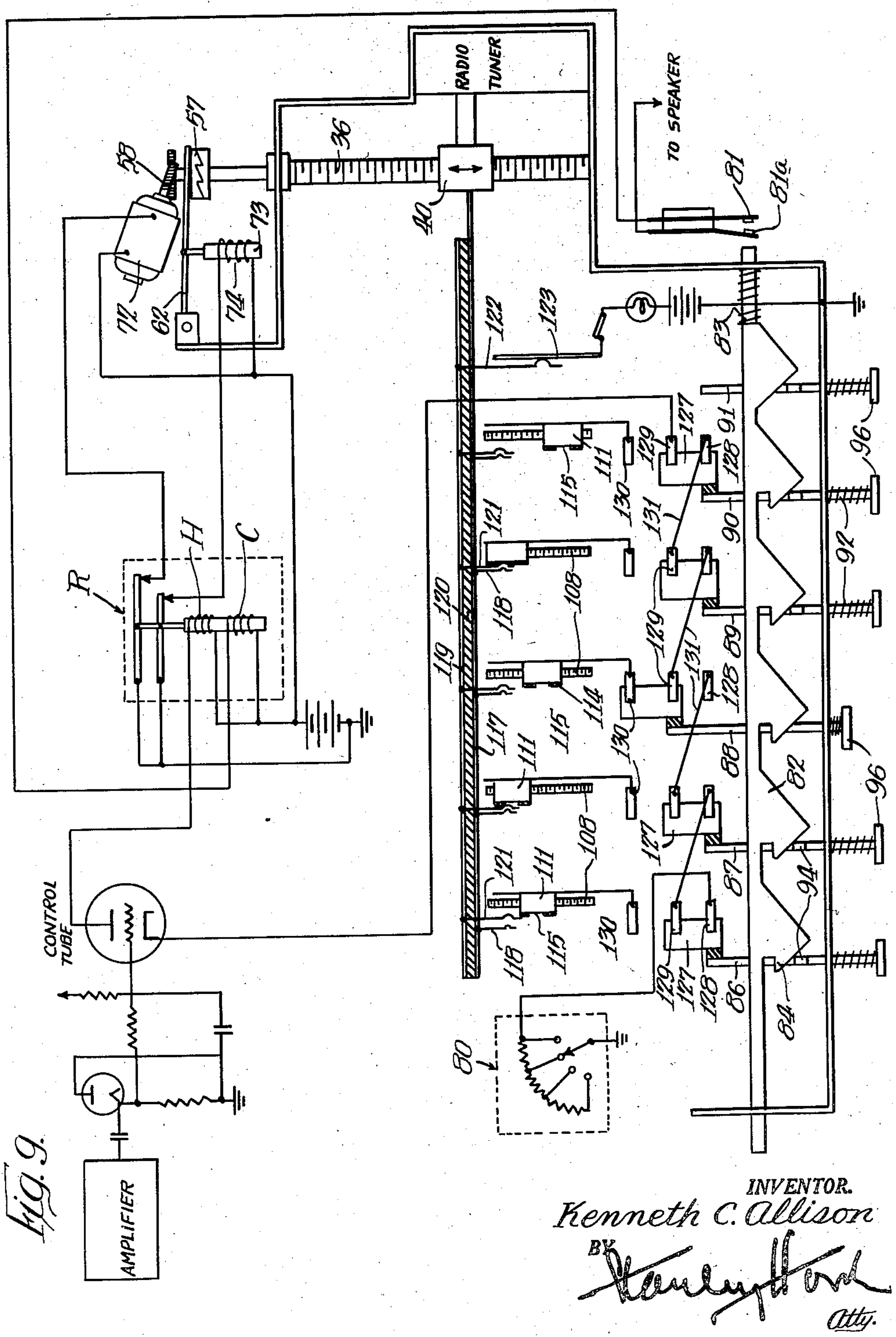
Fig. 9 is a circuit diagram as applied to the tuning apparatus of this invention.

Contact blade 128 engageable by the movable contact member 127 is joined to the contact blade 129 located in the path of an adjoining plunger by a bridge section 131. Thus when the plungers are in retracted or "off" position, the moving contact member 127 joins the contact blades 128 and 129 to form a continuous current path from the blade 128 in the path of plunger 86 to the blade 129 in the path of plunger 90 which path links the ground connection of sensitivity switch 80 to the cathode of control tube, as shown in Fig. 9. The holding coil H of relay R is energized through the plate circuit of the control tube while the closing coil C of relay R is energized momentarily by operation of switch 81. Accordingly, upon actuation of the switch 81 by movement of the plunger 91 to advanced or "on" position, the control tube operates to allow flow of current through the relay R to energize the circuit to the motor 72 and the solenoid coil 74 and upon reception of a sufficiently strong signal within the range of the tuning element, the current from the plate circuit of the control tube drops to such a level as to allow the relay R to open and thereby open the circuit to the motor and the solenoid coil whereupon the tuning apparatus is declutched and the motor is stopped and the receiver will remain tuned to the signal which is being so received until the switch 81 is again operated to energize the motor and solenoid coil circuit. It is to be noted that if the operator holds the plunger 91 in "on" position, switch 81 remains closed and the tuner will continue to be operated by the motor since the control tube is ineffective to open the relay R while the closing coil C is energized. Upon releasing the plunger 91 to "off" position, the control tube becomes effective to open the relay R in response to reception of an acceptable signal. By such repeated actuation of the plunger 91 to advanced or "on" position, all incoming signals of effective strength within the complete range of the tuning element as such signals are received in sequence according to frequency may be so applied to the motor and solenoid coil circuit.

The switching units controlled by the plungers 86 to 90 inclusive in response to actuation of a selected one of said plungers to advanced or "on" position provide for grounding of the control tube cathode via contacts 129 and 130 joined by moving contact member 127 of said plunger and contact finger 118 when the latter engages the area 115 of plate 111 adjustably supported on screw shaft 108 associated with said contact 130. Thus upon reception of a sufficiently strong incoming signal within the range of the tuning element and while said area 115 is so positioned along its range of adjustment as to be engaged by contact finger 118 during reception of such signal, the current path so established via contacts 129 and 130 to the finger 118 which is grounded to the carriage, enables the control tube to open the relay R controlling the circuit to the motor 72 and the solenoid coil 74 so as to deenergize the latter in response to reception of such signal and accordingly cause the carriage to stop while the receiver remains tuned to such signal. In establishing the adjusted position of the area 115 so that it will coincide with the arrival of the associated contact finger 118 in that portion of its travel during which the incoming signal is so received by the tuning element, contact finger 121 alongside said contact finger 118, which engages the area 115 simultaneously with the arrival of said finger 118 in the middle of said area 115, completes a circuit through strip 119, contact 122 and strip 123 to a lamp L whereby the latter is lighted. Thus the lamp provides an indicating means which is visible to the operator so as to announce correct positioning of the area 115 in relation to the cooperating contact finger 118 wherein such switching unit is effective to stop the carriage upon reception of an acceptable signal in said position of the area 115. Having therefore determined a pre-selected portion of the range of the tuning element through reception of a signal obtained via signal seeking action of the plunger 91, and while the receiver is so tuned to such signal, the cap 102 on the button 96 of a selected one of the plungers 86 to 90 inclusive is removed and the tube 100 associated therewith is rotated by turning the head 101 so as to cause the plate 111 supported on the screw shaft 108 engaged by said tube to be moved in either direction until such time as the contact finger 121 engages the area 115 of said plate 111 and thereby lights the lamp L, whereupon the cap 102 is replaced and the push button so selected while in advanced or "on" position is thereafter effective to cause the tuning element to pass up all other incoming signals and to allow the carriage to move until arrival of the carriage at a position wherein the switching unit associated with such selected push button and the contact finger 118 in alignment therewith are interengaged at which time the signal is applied to the circuit of the motor 72 and solenoid coil 74 through the relay R via the control tube to cause the carriage to stop. Similar adjustment is accordingly afforded in connection with the cooperating tube 100 and screw shaft 108 associated with each of the other plungers 86 to 90 inclusive.

Accordingly plunger 91 provides for operation of the tuning element over the entire range of the tuner for the selection of a signal to be tuned by each of the plungers 86 to 90, as well as for the reception of all signals of sufficient strength within the range of the tuner independently of the operation of the plungers 86 to 90 inclusive.

As the control tube operates to interrupt flow of current to the relay R so as to deenergize the circuit to the motor 72 and solenoid coil 74 in response to reception of a signal of effective strength within the range of the tuning element, the latter is brought to almost instantaneous stop as a result of the inherent friction load on the carriage and the interengaging parts of the worm 36 and the worm gear 37, thus avoiding the need of braking action between the clutch disk 65 and the manually operated disk 67.

Forces tending to tilt the bracket in the direction of rotation of the worm 36 about an axis intersecting the pivotal connection 45 and the corner of the bracket diagonally opposite said pivot connection are counteracted by a tongue 40a forming a lateral extension of the outer edge of the bracket strip 40 in alignment with the front bridge section 42 of the bracket and a slot $40^b$ provided in the ear 22 of the carriage end section 20 in which the tongue $40^a$ has relative sliding movement to accommodate angular movement of the bracket about said pivot connection 45. Thus the bracket and the worm gear 37 provides a link between the worm 36 and the carriage which is adapted to adjust itself to variations arising through wear of the parts as well as required manufacturing tolerances so as to afford a reliable driving connection between the carriage and the worm.

While but a single embodiment of the invention has been described in detail, it should be understood that the details thereof are not to be construed as limitative of the invention except insofar as set forth in the accompanying claims.

What is claimed is:

1. A tuning apparatus having a carriage mounted for movement in a linear path between two limiting positions, an adjustable tuning element connected to said carriage for movement therewith, an electric motor, an electrical circuit controlling said motor, means including said motor for actuating said carriage through energization of said motor control circuit, means through which an incoming signal of sufficient strength within the range of said tuning element is applied to said motor control circuit to stop said motor, said latter means including a plurality of contact fingers carried by said carriage and movable therewith in spaced apart parallel paths, and including a switching unit for each of said fingers including a current conductor with which said contact fingers on the carriage have engagement over a predetermined small portion of the distance of travel of the carriage, each of said current conductors having mounting on a screw threaded shaft having its axis in alignment with the line of motion of its cooperating contact finger on the carriage so as to occupy selected positions of adjustment throughout the range of travel of the cooperating contact finger on the carriage, each switching unit including a plunger normally biased to an off position and manually movable to an on position, a button on each plunger for actuating the same from off position to an on position, and rotation of the screw threaded shaft for adjusting the position of a current conductor of a switching unit with which a selected plunger is associated is effected by means of a tube supported in said button associated with said selected plunger having an end portion engageable with said threaded shaft.

2. A tuning apparatus having a carriage mounted for movement in a linear path between two limiting positions, an adjustable tuning element connected to said carriage for movement therewith, an electric motor, an electrical circuit controlling said motor, means including said motor for actuating said carriage through energization of said motor control circuit, means through which an incoming signal of sufficient strength within the range of said tuning element is applied to said motor control circuit to stop said motor, said latter means including a plurality of contact fingers carried by said carriage and movable therewith in spaced apart parallel paths, and including a switching unit for each of said fingers including a current conductor with which said contact fingers on the carriage have engagement over a predetermined small portion of the distance of travel of the carriage, each of said current conductors being mounted on a screw threaded shaft having its axis in alignment with the line of motion of its cooperating contact finger on the carriage so as to occupy selected positions of adjustment throughout the range of travel of the cooperating contact finger on the carriage, each switching unit including a plunger normally biased to an off position and manually movable to an on position, a button on each plunger for actuating the same from off position to an on position, each button having an operating member mounted therein for rotation about an axis in coaxial relation with the axis of the screw threaded shaft of the switching unit associated therewith through which operating member the screw threaded shaft is rotatable to effect adjustment of the current conductor supported on the shaft.

3. A tuning apparatus having a carriage mounted for movement in a linear path between two limiting positions, an adjustable tuning element connected to said carriage for movement therewith, an electric motor, an electrical circuit controlling said motor, means including said motor for actuating said carriage through energization of said motor control circuit, and means through which an incoming signal of sufficient strength within the range of said tuning element is applied to said motor control circuit to stop said motor, said latter means including a plurality of contact fingers carried by said carriage and movable therewith in spaced apart parallel paths, and including a switching unit for each of said fingers including a current conductor with which said contact fingers on the carriage have engagement over a predetermined small portion of the distance of travel of the carriage, said latter portion of carriage travel being defined by an insulating panel having an opening therein through which said current conductor is presented for engagement by said cooperating contact finger on the carriage.

4. A tuning apparatus having a rotatably supported worm, a carriage mounted for movement in a path between two limiting positions parallel to the axis of the worm, means through which the carriage is driven by said worm in one direction between said limiting positions including a worm gear and a worm gear supporting member, said supporting member being connected to the carriage so as to provide for limited swivelling action of the supporting member relative to the carriage, an electric motor, means through which said worm is rotated in response to operation of said motor including a clutch driving member having teeth defined by an edge parallel to the axis of rotation of the clutch driving member and a second or leading edge inclined toward the driving member in the direction of its rotation at an angle to the axis of rotation and a clutch driven member having teeth each defined by an edge parallel to the axis of rotation of the driving and driven members and a second edge inclined toward the clutch driving member at an angle coincident with the angle of inclination of said leading edge of the teeth on the clutch driving member with which the second edge of the clutch driving member has interfitting engagement to establish driving connection between said clutch driving and driven members.

5. A tuning apparatus as claimed in claim 3 wherein each contact finger on the carriage has engagement with a current conductor in the path of said finger through a terminal portion so arranged that its length of travel while so engaged with the current conductor is less than the dimension of said opening in the insulating panel measured lengthwise of the path of said finger.

6. A tuning apparatus as claimed in claim 3 wherein each contact finger on the carriage has engagement with a current conductor in the path of said finger through a terminal portion defined by a bend curved convexly in the direction of the current conductor about an axis transverse to the path of said finger and cam surfaces diverging from said bend in directions away from said current conductor with which the surfaces of the insulating panel associated with said current conductor have engagement to maintain the terminal out of engagement with the current conductor except when the terminal is relatively close to the middle of said current conductor, and means operative to indicate the arrival of said terminal at the middle of said current conductor including a second contact finger on said carriage engageable with said current conductor simultaneously with the arrival of said terminal of the first named contact finger at the middle of said current conductor, said second contact finger being restrained from engagement with said current conductor by said insulating panel associated with said current conductor while said first contact finger is away from said position at the middle of the current conductor.

7. A tuning apparatus as claimed in claim 3 wherein each contact finger on the carriage has engagement with a current conductor in the path of said finger through a terminal portion of such contour as to be deflected from a position of such engagement by the insulating panel associated with said current conductor except when the terminal is relatively close to the middle of the area of said current conductor, and means operative to close a circuit to an electrically controlled warning signal when the terminal arrives at said position in the middle of the area of said current conductor.

8. A tuning apparatus having a carriage mounted for movement in a linear path between two limiting positions, an adjustable tuning element connected to said carriage for movement therewith, an electric motor, means for actuating said carriage through energization of a circuit controlling said motor, and means through which an incoming signal of sufficient strength within the range of said tuning element is applied to the motor control circuit to stop said motor, said means for actuating said carriage including a worm adapted to be driven by said motor and a worm gear on the carriage with which the worm has driving engagement when the worm gear is locked against rotation, and a clutch through which the worm is driven by said motor, said clutch including a driving member having teeth defined by an edge parallel to the axis of rotation of the driving member and a second or leading edge inclined toward the driving member in the direction of its rotation at an angle to the axis of rotation and a driven member having teeth each defined by an edge parallel to the axis of rotation of the members and a second edge inclined toward the driving members at an angle coincident with the angle of inclination of said leading edge of the teeth on the driving member with which the second edge of the driving member has interfitting engagement to establish driving connection between said driving and driven members of the clutch.

References Cited in the file of this patent

UNITED STATES PATENTS

| | | |
|---|---|---|
| 1,248,323 | Hart | Nov. 27, 1917 |
| 2,208,549 | Plensler | July 16, 1940 |
| 2,394,869 | Nicholson | Feb. 12, 1946 |
| 2,501,003 | Pifer | Mar. 21, 1950 |
| 2,512,714 | Carlzen | June 27, 1950 |
| 2,529,660 | Meyer et al. | Nov. 14, 1950 |
| 2,744,193 | Schwarz | May 1, 1956 |